United States Patent
Khlat

(10) Patent No.: US 12,381,521 B2
(45) Date of Patent: Aug. 5, 2025

(54) RADIO FREQUENCY SIGNAL PHASE CORRECTION IN A DISTRIBUTED POWER MANAGEMENT CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 700 days.

(21) Appl. No.: 17/564,852

(22) Filed: Dec. 29, 2021

(65) Prior Publication Data
US 2022/0368295 A1 Nov. 17, 2022

Related U.S. Application Data

(60) Provisional application No. 63/188,019, filed on May 13, 2021, provisional application No. 63/188,026, filed on May 13, 2021.

(51) Int. Cl.
*H03F 3/24* (2006.01)
*H03H 11/16* (2006.01)

(52) U.S. Cl.
CPC .............. *H03F 3/245* (2013.01); *H03H 11/16* (2013.01); *H03F 2200/105* (2013.01); *H03F 2200/451* (2013.01)

(58) Field of Classification Search
CPC ............. H03F 3/245; H03F 2200/105; H03F 2200/451; H03F 1/0222; H03F 1/3288; H03F 3/19; H03F 2200/102; H03H 11/16
USPC ......................................................... 330/291
See application file for complete search history.

(56) References Cited

U.S. PATENT DOCUMENTS

| | | |
|---|---|---|
| 6,621,433 B1 | 9/2003 | Hertz |
| 7,546,137 B2 | 6/2009 | D'Hont et al. |
| 7,977,919 B1 | 7/2011 | Jaoude et al. |
| 9,577,771 B1 * | 2/2017 | Lashkarian ............... H03F 3/19 |
| 9,755,579 B1 | 9/2017 | Ahmed et al. |
| 11,165,515 B2 | 11/2021 | Tiebout et al. |
| 11,533,068 B1 | 12/2022 | Sharma et al. |

(Continued)

OTHER PUBLICATIONS

U.S. Appl. No. 17/564,734, filed Dec. 29, 2021.
(Continued)

*Primary Examiner* — Andrea Lindgren Baltzell
*Assistant Examiner* — Jose E Pinero
(74) *Attorney, Agent, or Firm* — WIthrow & Terranova, P.L.L.C.

(57) ABSTRACT

A distributed power management circuit is disclosed. Herein, a phase correction in a radio frequency (RF) signal is performed by a power management integrated circuit (PMIC), a distributed PMC, and a power amplifier circuit. The power amplifier circuit includes a phase shifter circuit configured to phase-shift the RF signal based on a phase correction signal and a power amplifier configured to amplify the phase-shifted RF signal based on a modulated voltage. The distributed PMIC is configured to generate the phase correction signal and the modulated voltage based on a modulated target voltage. The PMIC is configured to generate the modulated target voltage based on a time-variant power envelope of the RF signal. As a result, the modulated voltage and the time-variant power envelope can be better aligned in time and/or phase at the power amplifier circuit to thereby improve efficiency and linearity of the power amplifier.

20 Claims, 3 Drawing Sheets

(56) References Cited

U.S. PATENT DOCUMENTS

Figure 1:
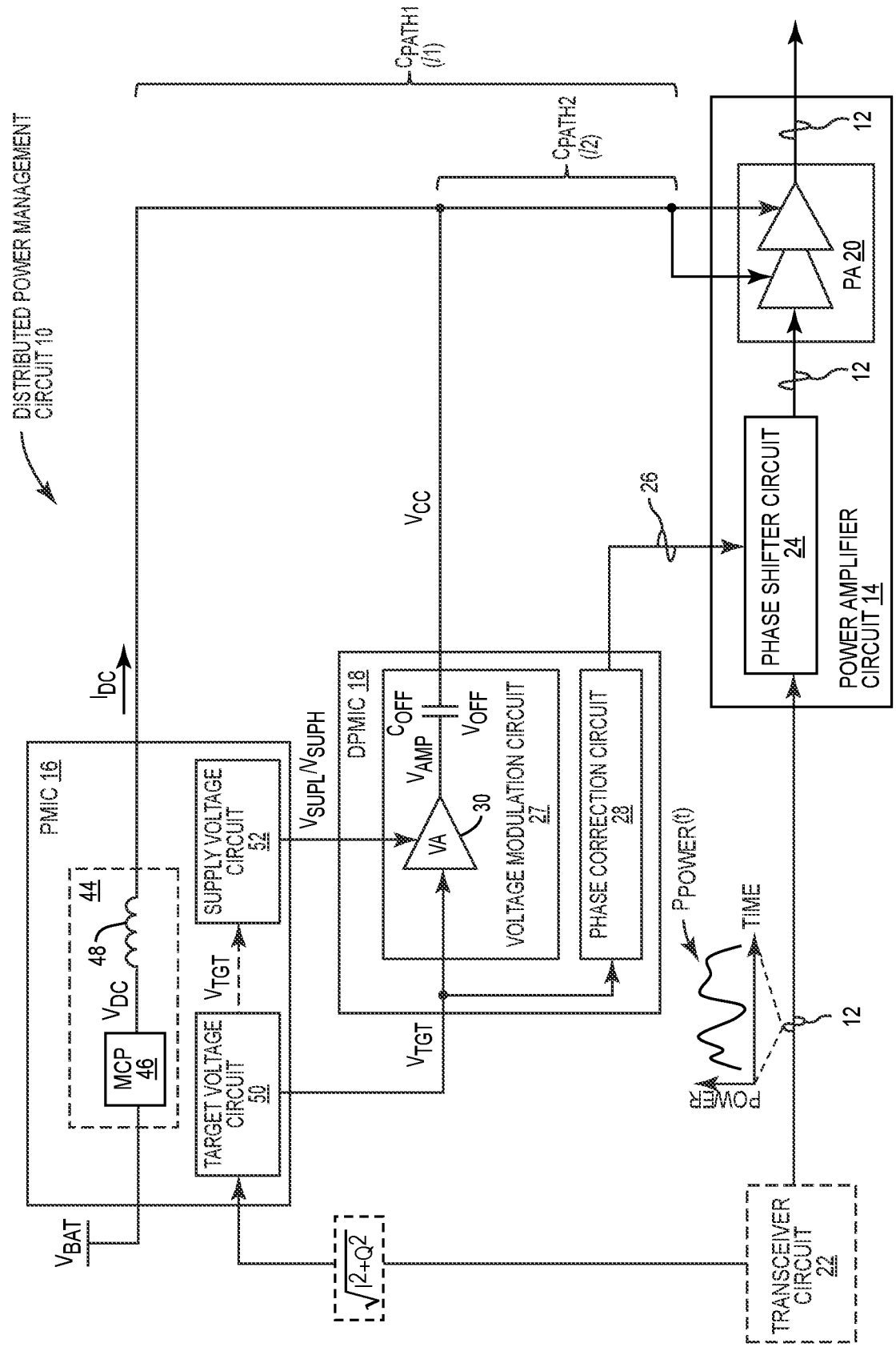

| | | |
|---|---|---|
| 2007/0189417 A1 | 8/2007 | Waheed et al. |
| 2012/0140852 A1 | 6/2012 | Kato et al. |
| 2016/0164551 A1 | 6/2016 | Khlat et al. |
| 2016/0249300 A1 | 8/2016 | Tsai et al. |
| 2022/0069774 A1 | 3/2022 | Emira et al. |
| 2022/0368283 A1 | 11/2022 | Folkmann et al. |
| 2022/0368293 A1 | 11/2022 | Khlat |
| 2022/0368294 A1 | 11/2022 | Khlat |
| 2022/0368300 A1 | 11/2022 | Khlat |
| 2023/0080652 A1 | 3/2023 | Khlat et al. |

OTHER PUBLICATIONS

U.S. Appl. No. 17/536,189, filed Nov. 29, 2021.
U.S. Appl. No. 17/536,234, filed Nov. 29, 2021.
U.S. Appl. No. 17/552,791, filed Dec. 16, 2021.
Non-Final Office Action for U.S. Appl. No. 17/564,734, mailed Jul. 17, 2024, 9 pages.
Non-Final Office Action for U.S. Appl. No. 17/552,791, mailed Jun. 21, 2024, 6 pages.
Final Office Action for U.S. Appl. No. 17/564,734, mailed Sep. 25, 2024, 10 pages.
Non-Final Office Action for U.S. Appl. No. 17/536,189, mailed Oct. 1, 2024, 12 pages.
Non-Final Office Action for U.S. Appl. No. 17/536,234, mailed Oct. 16, 2024, 17 pages.
Notice of Allowance for U.S. Appl. No. 17/552,791, mailed Oct. 15, 2024, 7 pages.

\* cited by examiner

RADIO FREQUENCY SIGNAL PHASE CORRECTION IN A DISTRIBUTED POWER MANAGEMENT CIRCUIT

RELATED APPLICATIONS

This application claims the benefit of provisional patent application Ser. No. 63/188,026, filed May 13, 2021, and the benefit of provisional patent application Ser. No. 63/188,019, filed May 13, 2021, the disclosures of which are hereby incorporated herein by reference in their entireties.

FIELD OF THE DISCLOSURE

The technology of the disclosure relates generally to radio frequency (RF) signal phase correction across a power management integrated circuit (PMIC), a distributed PMIC, and a power amplifier circuit.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

A fifth-generation new radio (5G-NR) wireless communication system is widely regarded as a technological advancement that can achieve significantly higher data throughput, improved coverage range, enhanced signaling efficiency, and reduced latency compared to the existing third-generation (3G) and fourth-generation (4G) communication systems. A 5G-NR mobile communication device usually transmits and receives a radio frequency (RF) signal(s) in a millimeter wave (mmWave) RF spectrum that is typically above 6 GHz. Notably, the RF signal(s) transmitted in the mmWave RF spectrum may be more susceptible to propagation attenuation and interference that can result in substantial reduction in data throughput. To help mitigate propagation attenuation and maintain desirable data throughput, the 5G-NR mobile communication device employs a power amplifier(s) to amplify the RF signal(s) before transmitting in the mmWave RF spectrum.

Envelope tracking (ET) is a power management technique designed to improve operating efficiency of the power amplifier(s). Specifically, the power amplifier(s) is configured to amplify the RF signal(s) based on a time-variant ET voltage that closely tracks a time-variant power envelope of the RF signal(s). The time-variant voltage is typically generated by an ET integrated circuit (ETIC) in the wireless communication device. Notably, the inherent processing delay associated with the ETIC can inadvertently cause the time-variant ET voltage to misalign in time and/or phase with the time-variant power envelope of the RF signal(s). As a result, the peaks of the time-variant ET voltage may become misaligned with the peaks of the time-variant power envelope, which may cause the power amplifier(s) to clip and distort the RF signal(s). In this regard, it is desirable to ensure that the ETIC can maintain good time and phase alignment between the time-variant ET voltage and the time-variant power envelope of the RF signal(s).

SUMMARY

Aspects disclosed in the detailed description include a distributed power management circuit operable to perform phase correction in a radio frequency (RF) circuit. Herein, the phase correction is performed across multiple circuits that a physically separated from one another. More specifically, the phase correction in the RF signal is performed by a power management integrated circuit (PMIC), a distributed PMC, and a power amplifier circuit, which is located closer to the distributed PMIC than to the PMIC. The power amplifier circuit includes a phase shifter circuit configured to phase-shift the RF signal based on a phase correction signal and a power amplifier configured to amplify the phase-shifted RF signal based on a modulated voltage. The distributed PMIC is configured to generate the phase correction signal and the modulated voltage based on a modulated target voltage. The PMIC is configured to generate the modulated target voltage based on a time-variant power envelope of the RF signal. As a result, the modulated voltage and the time-variant power envelope can be better aligned in time and/or phase at the power amplifier circuit to thereby improve efficiency and linearity of the power amplifier.

In one aspect, a distributed power management circuit is provided. The distributed power management circuit includes a power amplifier circuit. The power amplifier circuit includes a phase shifter circuit. The phase shifter circuit is configured to phase shift an RF signal based on a phase correction signal. The power amplifier circuit also includes a power amplifier. The power amplifier is configured to amplify the phase-shifted RF signal based on a modulated voltage. The distributed power management circuit also includes a distributed PIMC. The distributed PMIC is configured to generate the phase correction signal and the modulated voltage based on a modulated target voltage. The distributed power management circuit also includes a PMIC. The PMIC is configured to generate the modulated target voltage based on a time-variant power envelope of the RF signal.

In another aspect, a distributed power management circuit is provided. The distributed power management circuit includes a power amplifier circuit. The power amplifier circuit includes a phase shifter circuit. The phase shifter circuit is configured to phase shift an RF signal based on a phase correction signal. The power amplifier circuit also includes a power amplifier. The power amplifier is configured to amplify the phase-shifted RF signal based on a modulated voltage. The distributed power management circuit also includes a distributed PIMC. The distributed PMIC is configured to generate the phase correction signal and the modulated voltage based on a modulated target voltage. The distributed power management circuit also includes a PMIC. The PMIC is configured to generate the modulated target voltage based on a time-variant power envelope of the RF signal. The distributed power management circuit also includes a transceiver circuit. The transceiver circuit is configured to generate the RF signal associated with the time-variant power envelope.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

Figure 2:
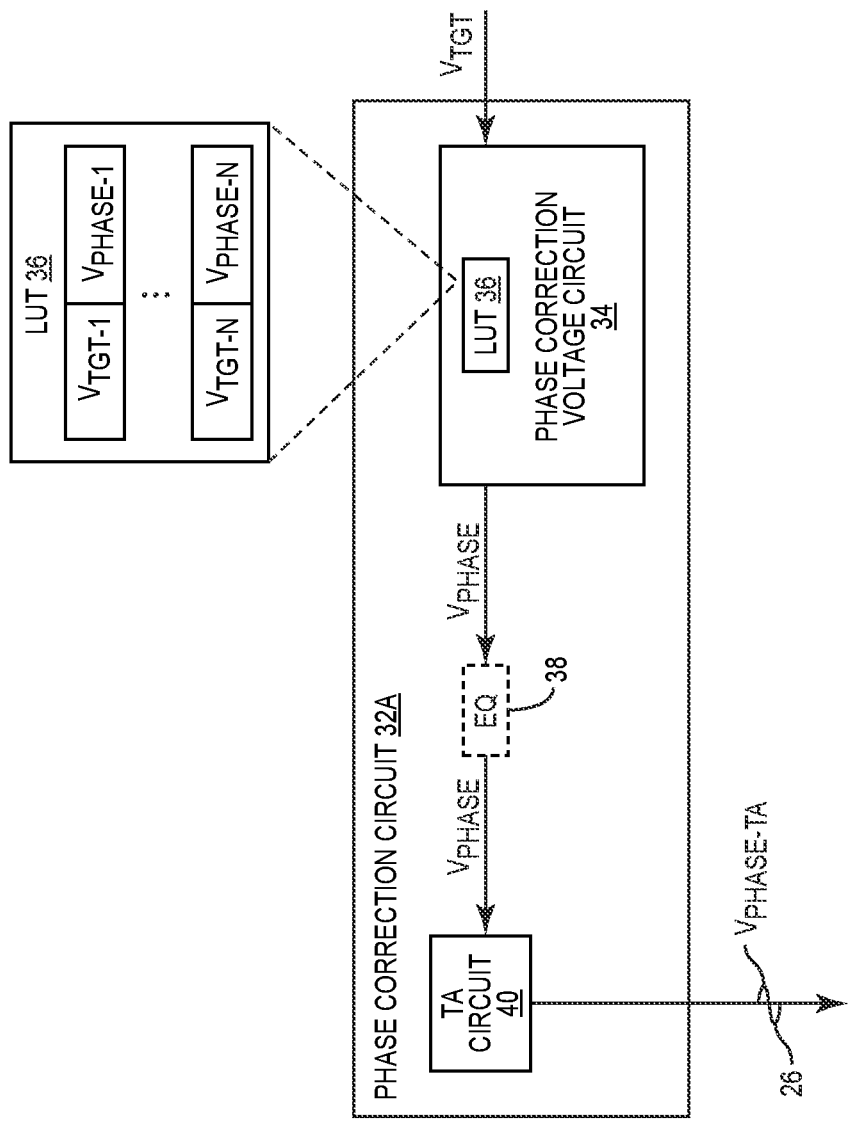
Figure 3:
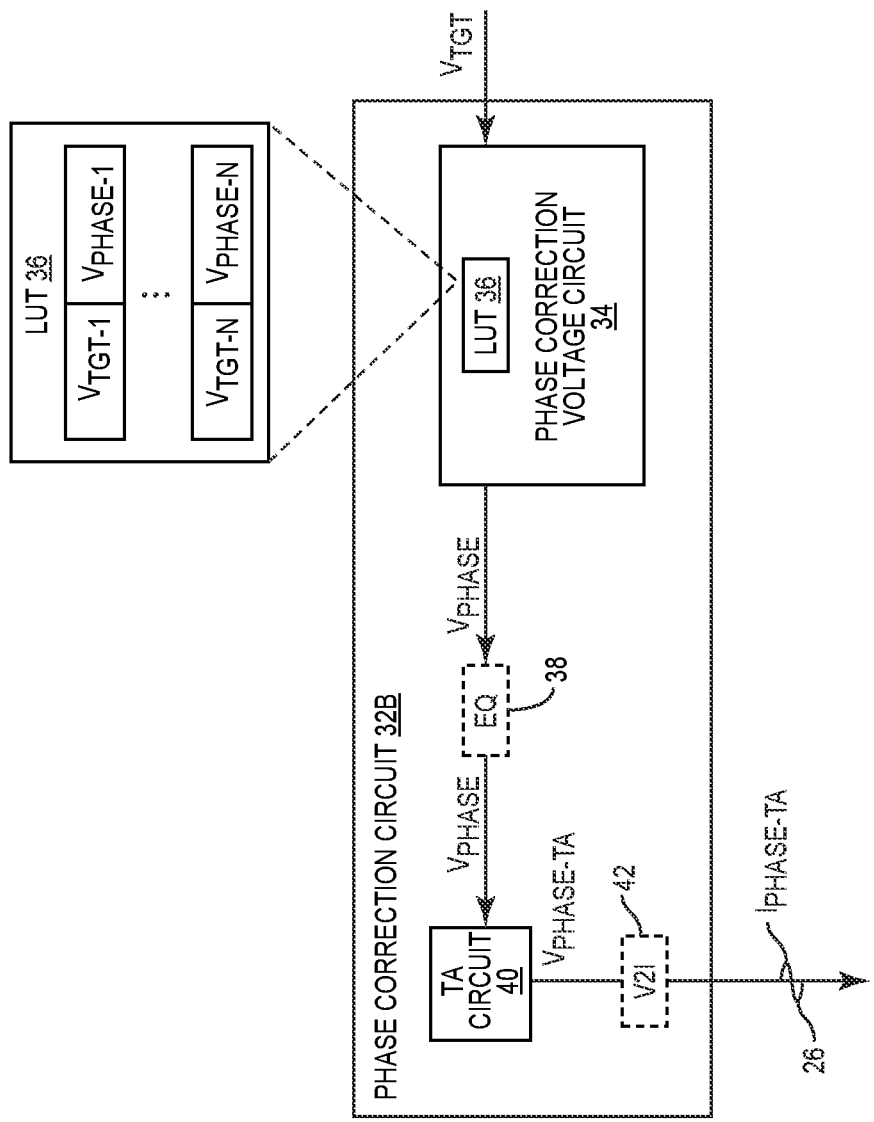

FIG. 1 is a schematic diagram of an exemplary distributed power management circuit configured according to embodiments of the present disclosure to support phase correction in a radio frequency (RF) signal based on a modulated phase correction signal;

FIG. 2 is a schematic diagram of an exemplary phase correction circuit, which can be provided in the distributed power management circuit of FIG. 1, to generate the modulated phase correction signal according to an embodiment of the present disclosure; and FIG. 3 is a schematic diagram of an exemplary phase correction circuit, which can be provided in the distributed power management circuit of FIG. 1, to generate the modulated phase correction signal according to another embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a distributed power management circuit operable to perform phase correction in a radio frequency (RF) circuit. Herein, the phase correction is performed across multiple circuits that a physically separated from one another. More specifically, the phase correction in the RF signal is performed by a power management integrated circuit (PMIC), a distributed PMC, and a power amplifier circuit, which is located closer to the distributed PMIC than to the PMIC. The power amplifier circuit includes a phase shifter circuit configured to phase-shift the RF signal based on a phase correction signal and a power amplifier configured to amplify the phase-shifted RF signal based on a modulated voltage. The distributed PMIC is configured to generate the phase correction signal and the modulated voltage based on a modulated target voltage. The PMIC is configured to generate the modulated target voltage based on a time-variant power envelope of the RF signal. As a result, the modulated voltage and the time-variant power envelope can be better aligned in time and/or phase at the power amplifier circuit to thereby improve efficiency and linearity of the power amplifier.

FIG. 1 is a schematic diagram of an exemplary distributed power management circuit 10 configured according to embodiments of the present disclosure to support phase correction in an RF signal 12. The distributed power management circuit 10 includes multiple physically separated circuits. More specifically, the distributed power management circuit 10 includes a power amplifier circuit 14, a PMIC 16, and a distributed PMIC 18, each physically separated from one another.

The PMIC 16 is coupled to the power amplifier circuit 14 via a first conductive path $C_{PATH1}$ and the distributed PMIC 18 is coupled to the power amplifier circuit 14 via a second conductive path $C_{PATH2}$ that is shorter than the first conductive path $C_{PATH1}$. Herein, the second conductive path $C_{PATH2}$ is said to be shorter than the first conductive path $C_{PATH1}$ in that the first conductive path $C_{PATH1}$ is associated with respective trace inductance (I1) that is larger than a respective trace inductance (I2) of the second conductive path $C_{PATH2}$. As such, the distributed PMIC 18 is closer to the power amplifier circuit 14 than does the PMIC 16.

In an embodiment, the power amplifier circuit 14 includes a power amplifier 20 configured to amplify the RF signal 12 based on a modulated voltage $V_{CC}$, and the distributed PMIC 18 is configured to generate the modulated voltage $V_{CC}$. In a non-limiting example, the distributed power management circuit 10 can include or be coupled to a transceiver circuit 22. The transceiver circuit 22 is configured to generate the RF signal 12 associated with a time-variant power envelope $P_{POWER}(t)$. Given that the transceiver circuit 22 and the distributed PMIC 18 are separated circuits, the RF signal 12 and the modulated voltage $V_{CC}$ may arrive at the power amplifier circuit 14 via different conductive paths. As a result, the time-variant power envelope $P_{POWER}(t)$ may be misaligned in phase with the modulated voltage $V_{CC}$, thus causing potential distortion (e.g., amplitude clipping) in the RF signal 12 and/or efficiency degradation in the power amplifier 20. Hence, it is desirable to ensure good phase alignment between the time-variant power envelope $P_{POWER}(t)$ and the modulated voltage $V_{CC}$ at the power amplifier 20.

In this regard, the power amplifier circuit 14 is further configured to include a phase shifter circuit 24, which may be coupled between the transceiver circuit 22 and the power amplifier 20. The phase shifter circuit 24 is configured to phase-shift the RF signal 12 based on a phase correction signal 26 to thereby cause the time-variant power envelope $P_{POWER}(t)$ to be phase aligned with the modulated voltage $V_{CC}$ at the power amplifier circuit 14. As a result, it is possible to ensure good phase alignment between the time-variant power envelope $P_{POWER}(t)$ and the modulated voltage $V_{CC}$ at the power amplifier 20 to hereby avoid potential distortion (e.g., amplitude clipping) in the RF signal 12 and/or efficiency degradation in the power amplifier 20.

In an embodiment, the distributed PMIC 18 includes a voltage modulation circuit 27 and a phase correction circuit 28. The voltage modulation circuit 27 includes a voltage amplifier 30 (denoted as "VA") and an offset capacitor $C_{OFF}$ coupled in series with the voltage amplifier 30. The voltage amplifier 30 is configured to generate an initial modulated voltage $V_{AMP}$ based on a modulated target voltage $V_{TGT}$. The offset capacitor $C_{OFF}$ is configured to raise the initial modulated voltage $V_{AMP}$ by an offset voltage $V_{OFF}$ (e.g., 0.8 V) to generate the modulated voltage $V_{CC}$ ($V_{CC}=V_{AMP}+V_{OFF}$). The modulated target voltage $V_{TGT}$ is generated based on the time-variant power envelope $P_{POWER}(t)$. As a result, the modulated voltage $V_{CC}$ can be generated to track the time-variant power envelope $P_{POWER}(t)$.

The phase correction circuit 28 is configured to generate the phase correction signal 26 as a function of the modulated target voltage $V_{TGT}$. As discussed below in FIGS. 2 and 3, the phase correction circuit 28 can generate the phase correction signal 26 as a voltage signal or a current signal.

In one embodiment, the phase correction circuit 28 is configured to generate the phase correction signal 26 as a voltage signal. In this regard, FIG. 2 is a schematic diagram of an exemplary phase correction circuit 32A, which can be provided in the distributed power management circuit 10 of FIG. 1, to generate the phase correction signal 26 to include a modulated phase correction voltage $V_{PHASE}$. Common elements between FIGS. 1 and 2 are shown therein with common element numbers and will not be re-described herein.

The phase correction circuit 32A includes a phase correction voltage circuit 34. The phase correction voltage circuit 34 is configured to generate a modulated phase correction voltage $V_{PHASE}$, which can be a differential voltage as an example, based on the modulated target voltage $V_{TGT}$. Specifically, the phase correction voltage circuit 34 may be configured to generate the modulated phase correction voltage $V_{PHASE}$ based a phase correction voltage lookup table (LUT) 36, which is configured to correlate various levels of the modulated phase correction voltage $V_{PHASE}$ with various levels of the modulated target voltage $V_{TGT}$. In an embodiment, the phase correction voltage LUT 36 includes multiple phase correction voltages $V_{PHASE-1}$-$V_{PHASE-N}$, each corresponding to a respective one of multiple modulated target voltage levels $V_{TGT-1}$-$V_{TGT-N}$. In a non-limiting example, the modulated target voltage levels $V_{CC-1}$-$V_{CC-N}$ is stored in the phase correction voltage LUT 36 in an ascending order ($V_{TGT-1} < V_{TGT-2} < \ldots < V_{TGT-N}$).

In this regard, the phase correction voltage circuit 34 may select one of the phase correction voltages $V_{PHASE-1}$-$V_{PHASE-N}$ from the phase correction voltage LUT 36 based on a respective level of the modulated target voltage $V_{TGT}$ and output the selected one of the phase correction voltages $V_{PHASE-1}$-$V_{PHASE-N}$ as the phase correction voltage $V_{PHASE}$. As an example, if the respective level of the modulated target voltage $V_{TGT}$ is greater than or equal to the modulated target voltage level $V_{TGT-1}$ but less than the modulated target voltage level $V_{TGT-2}$ ($V_{TGT-1}$ $V_{TGT} < V_{TGT-2}$), the phase correction voltage circuit 34 may select and output the phase correction voltage $V_{PHASE-1}$ as the modulated phase correction voltage $V_{PHASE}$.

The phase correction circuit 32A may include a voltage equalizer circuit 38 (denoted as "EQ") to equalize the modulated phase correction voltage $V_{PHASE}$. Specifically, the voltage equalizer circuit 38 may help smooth out ripples in the modulated phase correction voltage $V_{PHASE}$, which may be resulted by, for example, trace inductance and/or capacitance associated with the second conductive path $C_{PATH2}$.

Since the modulated phase correction voltage $V_{PHASE}$ and the modulated voltage $V_{CC}$ are both generate based on the modulated target voltage $V_{TGT}$, there is a likelihood for the modulated phase correction voltage $V_{PHASE}$ to lag the modulated voltage $V_{CC}$ in time. As such, the phase correction circuit 32A can be configured to include a time advance circuit 40. Specifically, the time advance circuit 40 can be configured to time advance the modulated phase correction voltage $V_{PHASE}$ by a selected time advance value to generate a time-advanced modulated phase correction voltage $V_{PHASE}$-TA that is time aligned with the modulated voltage $V_{CC}$. For an in-depth description as to how the time advance circuit 40 operates, please refer to U.S. patent application Ser. No. 17/536,234, entitled "TIME-ADVANCED PHASE CORRECTION IN A POWER AMPLIFIER CIRCUIT." Accordingly, the phase correction circuit 32A can generate the phase correction signal 26 that includes the time-advanced modulated phase correction voltage $V_{PHASE-TA}$.

With reference back to FIG. 1, the phase shifter circuit 24 may be configured to determine a phase shift corresponding to the time-advanced modulated phase correction voltage $V_{PHASE-TA}$ and phase-shift the RF signal 12 based on the determined phase shift. In an embodiment, the phase shifter circuit 24 can include internal storage (not shown), such as registers for example, to store a correlation between various levels of the time-advanced modulated phase correction voltage $V_{PHASE-TA}$ and various degrees of phase shift. For example, the time-advanced modulated phase correction voltage $V_{PHASE-TA}$ of 0 V, 1 V, and 2 V can be correlated with 0°, 1°, and 2° of phase shift, respectively. As such, the phase shifter circuit 24 can easily determine the phase shift based on the time-advanced modulated phase correction voltage $V_{PHASE-TA}$ and phase-shift the RF signal 12 accordingly.

In an alternative embodiment, the phase correction circuit 28 is configured to generate the phase correction signal 26 as a current signal. In this regard, FIG. 3 is a schematic diagram of an exemplary phase correction circuit 32B, which can be provided in the distributed power management circuit 10 of FIG. 1, to generate the phase correction signal 26 to include a modulated phase correction current $I_{PHASE}$. Common elements between FIGS. 1, 2, and 3 are shown therein with common element numbers and will not be re-described herein.

The phase correction circuit 32B includes a voltage-to-current (V2I) conversion circuit 42, which may be a transconductance circuit, as an example. The V2I conversion circuit 42 is configured to convert the time-advanced modulated phase correction voltage $V_{PHASE-TA}$ into a time-advanced modulated phase correction current $I_{PHASE-TA}$. Accordingly, the phase correction circuit 32B can generate the phase correction signal 26 that includes the time-advanced modulated phase correction current $I_{PHASE-TA}$.

With reference back to FIG. 1, the phase shifter circuit 24 can include internal storage (not shown), such as registers for example, to store a correlation between various levels of the time-advanced modulated phase correction current $I_{PHASE-TA}$ and various degrees of phase shift. For example, the time-advanced modulated phase correction current $I_{PHASE-TA}$ of 0 A, 1 A, and 2 A can be correlated with 0°, 1°, and 2° of phase shift, respectively. As such, the phase shifter circuit 24 can easily determine the phase shift based on the time-advanced modulated phase correction current $I_{PHASE-TA}$ and phase-shift the RF signal 12 accordingly.

The PMIC 16 can be configured to include a switcher circuit 44. The switcher circuit 44. In an embodiment, the switcher circuit 44 includes a multi-level charge pump (MCP) 46 coupled in series with a power inductor 48. The MCP 46 is configured to generate a low-frequency voltage $V_{DC}$ (e.g., a direct-current (DC) voltage) at multiple levels, each as a function of a battery voltage $V_{BAT}$. In a non-limiting example, the MCP 46 may operate in a buck mode to generate the low-frequency voltage $V_{DC}$ at $0 \times V_{BAT}$ or $1 \times V_{BAT}$, or in a boost mode to generate the low-frequency voltage $V_{DC}$ at $2 \times V_{BAT}$. As such, by toggling between different levels of the low-frequency voltage $V_{DC}$ based on certain duty cycle, the MCP 46 is able to generate the low-frequency voltage $V_{DC}$ at levels other than $0 \times V_{BAT}$, $1 \times V_{BAT}$, and $2 \times V_{BAT}$. For example, by toggling between $0 \times V_{BAT}$, $1 \times V_{BAT}$, and $2 \times V_{BAT}$ based on a 30%, 30%, and 40% duty cycle, the MCP 46 is able to generate the low-frequency voltage $V_{DC}$ at $1.1 \times V_{BAT}$ ($0 \times V_{BAT} \times 30\% + 1 \times V_{BAT} \times 30\% + 2 \times V_{BAT} \times 40\%$).

The power inductor 48 is configured to induce a low-frequency current IDC (e.g., a DC current) based on the low-frequency voltage $V_{DC}$. The switcher circuit 44 is coupled to the power amplifier 20 and configured to provide the low-frequency current IDC to the power amplifier 20 via the first conductive path $C_{PATH1}$. In an embodiment, the switcher circuit 44 can also be coupled to the offset capacitor $C_{OFF}$. In this regard, the low-frequency current IDC can also be utilized to modulate the offset voltage $V_{OFF}$ across the offset capacitor $C_{OFF}$.

As mentioned earlier, the transceiver circuit 22 is configured to generate the RF signal 12 associated with the time-variant power envelope $P_{POWER}(t)$. In a non-limiting example, the transceiver circuit 2 can include a digital baseband circuit (not shown) that generate a digital version of the RF signal 12 and a digital-to-analog converter (not shown) to convert the digital version of the RF signal 12 into the RF signal 12. In an embodiment, the digital version of the RF signal 12 can be so generated to include an in-phase (I) component and a quadrature (Q) component. Accordingly, the transceiver circuit 22 can sample the time-variant power envelope $P_{POWER}(t)$ to thereby determine a time-variant power level (expressed as $\sqrt{I^2+Q^2}$) of the time-variant power envelope $P_{POWER}(t)$.

The PMIC 16 can include a target voltage circuit 50. The target voltage circuit 50 can be configured to generate the modulated target voltage $V_{TGT}$ based on the time-variant power level $\sqrt{I^2+Q^2}$ of the time-variant power envelope $P_{POWER}(t)$. In an embodiment, the target voltage circuit 50 may generate the modulated target voltage $V_{TGT}$ based on a target voltage lookup LUT (not shown) that correlates the time-variant power level $\sqrt{I^2+Q^2}$ of the time-variant power envelope $P_{POWER}(t)$ with multiple target voltages. For a detailed description as to how the target voltage circuit 50 can generate the modulated target voltage $V_{TGT}$ based on the time-variant power level $\sqrt{I^2+Q^2}$ of the time-variant power envelope $P_{POWER}(t)$, please refer to U.S. patent application Ser. No. 17/361,189, entitled "POWER MANAGEMENT CIRCUIT SUPPORTING PHASE CORRECTION IN AN ANALOG SIGNAL."

In an embodiment, the voltage amplifier 30 is configured to generate the initial modulated voltage $V_{AMP}$ based on a selected one of multiple supply voltages $V_{SUPL}$, $V_{SUPH}$ ($V_{SUPH} > V_{SUPL}$). In this regard, the PMIC 16 can be configured to further include a supply voltage circuit 52 to generate the supply voltages $V_{SUPL}$, $V_{SUPH}$. The supply voltage circuit 52 may be made aware of the modulated target voltage $V_{TGT}$ and supply the selected one of the supply voltages $V_{SUPL}$, $V_{SUPH}$ to the voltage amplifier 30 based on the modulated target voltage $V_{TGT}$. For example, the supply voltage circuit 52 may provide the lower supply voltage $V_{SUPL}$ to the voltage amplifier 30 when the modulated target voltage $V_{TGT}$ is below an established threshold or provide the higher supply voltage $V_{SUPH}$ to the voltage amplifier 30 when the modulated target voltage $V_{TGT}$ is above or equal to the established threshold. As the supply voltages $V_{SUPL}$, $V_{SUPH}$ are typically applied as bias voltages to an output transistor (not shown) in the voltage amplifier 30, choosing an appropriate one of the supply voltages $V_{SUPL}$, $V_{SUPH}$ can have direct impact on operating efficiency of the voltage amplifier 30.

Those skilled in the art will recognize improvements and modifications to the preferred embodiments of the present disclosure. All such improvements and modifications are considered within the scope of the concepts disclosed herein and the claims that follow.

What is claimed is:

1. A distributed power management circuit comprising:
   a power amplifier circuit comprising:
      a phase shifter circuit configured to phase shift a radio frequency (RF) signal based on a phase correction signal; and
      a power amplifier configured to amplify the phase-shifted RF signal based on a modulated voltage;
   a distributed power management integrated circuit (PMIC) configured to generate the phase correction signal and the modulated voltage based on a modulated target voltage; and
   a PMIC configured to generate the modulated target voltage based on a time-variant power envelope of the RF signal.

2. The distributed power management circuit of claim 1, wherein:
   the PMIC is coupled to the power amplifier via a first conductive path; and the distributed PMIC is coupled to the power amplifier via a second conductive path shorter than the first conductive path.

3. The distributed power management circuit of claim 1, wherein the distributed PMIC comprises:
a voltage modulation circuit configured to generate the modulated voltage based on the modulated target voltage; and
a phase correction circuit configured to generate the phase correction signal based on the modulated target voltage to thereby cause the phase shifter circuit to phase-shift the RF signal.

4. The distributed power management circuit of claim 3, wherein the phase correction circuit comprises a phase correction voltage circuit configured to generate a modulated phase correction voltage based on a phase correction voltage lookup table (LUT) comprising a plurality of phase correction voltages each corresponding to a respective level of the modulated target voltage.

5. The distributed power management circuit of claim 4, wherein the phase correction circuit further comprises a voltage equalizer circuit configured to equalize the modulated phase correction voltage.

6. The distributed power management circuit of claim 4 wherein the phase correction circuit further comprises a time advance circuit configured to time advance the modulated phase correction voltage by a selected time advance value to generate a time-advanced modulated phase correction voltage that is time aligned with the modulated voltage.

7. The distributed power management circuit of claim 6, wherein the phase correction circuit is further configured to generate the phase correction signal comprising the time-advanced modulated phase correction voltage.

8. The distributed power management circuit of claim 7, wherein the phase shifter circuit is further configured to:
determine a phase shift corresponding to the time-advanced modulated phase correction voltage; and
phase-shift the RF signal based on the determined phase shift.

9. The distributed power management circuit of claim 6, wherein the phase correction circuit further comprises a voltage-to-current conversion circuit configured to convert the time-advanced modulated phase correction voltage into a time-advanced modulated phase correction current.

10. The distributed power management circuit of claim 9, wherein the phase shifter circuit is further configured to:
determine a phase shift corresponding to the time-advanced modulated phase correction current; and
phase-shift the RF signal based on the determined phase shift.

11. The distributed power management circuit of claim 3, wherein the voltage modulation circuit comprises:
a voltage amplifier configured to generate an initial modulated voltage based on the modulated target voltage; and
an offset capacitor configured to raise the initial modulated voltage by an offset voltage to generate the modulated voltage.

12. The distributed power management circuit of claim 11, wherein the voltage amplifier is further configured to generate the initial modulated voltage based on a selected one of a plurality of supply voltages.

13. The distributed power management circuit of claim 12, wherein the PMIC comprises a supply voltage circuit configured to generate the plurality of supply voltages.

14. The distributed power management circuit of claim 1, wherein the PMIC comprises a switcher circuit coupled to the power amplifier and configured to provide a low-frequency current to the power amplifier.

15. The distributed power management circuit of claim 14, wherein the switcher circuit comprises:
a multi-level charge pump (MCP) configured to generate a low-frequency voltage as a function of a battery voltage; and
a power inductor coupled to the MCP and configured to induce the low-frequency current based on the low-frequency voltage.

16. The distributed power management circuit of claim 1, further comprising a transceiver circuit configured to generate the RF signal associated with the time-variant power envelope.

17. The distributed power management circuit of claim 16, wherein the transceiver circuit is further configured to provide a time-variant power level of the time-variant power envelope to the PMIC.

18. The distributed power management circuit of claim 17, wherein the PMIC comprises a target voltage circuit configured to generate the modulated target voltage based on the time-variant power level of the time-variant power envelope.

19. The distributed power management circuit of claim 18, wherein the target voltage circuit comprises a target voltage lookup table (LUT) configured to correlate the time-variant power level of the time-variant power envelope with a plurality of target voltages.

20. A distributed power management circuit comprising:
a power amplifier circuit comprising:
a phase shifter circuit configured to phase shift a radio frequency (RF) signal based on a phase correction signal; and
a power amplifier configured to amplify the phase-shifted RF signal based on a modulated voltage;
a distributed power management integrated circuit (PMIC) configured to generate the phase correction signal and the modulated voltage based on a modulated target voltage;
a PMIC configured to generate the modulated target voltage based on a time-variant power envelope of the RF signal; and
a transceiver circuit configured to generate the RF signal associated with the time-variant power envelope.

* * * * *